(12) United States Patent
Przadka

(10) Patent No.: US 7,795,992 B2
(45) Date of Patent: Sep. 14, 2010

(54) ELECTRICAL CIRCUIT COMPRISING A DIFFERENTIAL SIGNAL PATH AND COMPONENT WITH SUCH A CIRCUIT

(75) Inventor: Andreas Przadka, Munich (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/400,161

(22) Filed: Mar. 9, 2009

(65) Prior Publication Data

US 2009/0212880 A1    Aug. 27, 2009

Related U.S. Application Data

(63) Continuation of application No. PCT/DE2007/001752, filed on Sep. 27, 2007.

(30) Foreign Application Priority Data

Sep. 29, 2006   (DE) ...................... 10 2006 046 279

(51) Int. Cl.
*H03H 7/38*    (2006.01)

(52) U.S. Cl. ...................................................... 333/32
(58) Field of Classification Search .................. 333/32, 333/33

See application file for complete search history.

(56) References Cited

U.S. PATENT DOCUMENTS

| 6,900,705 B2 | 5/2005 | Nakamura et al. |
| 7,176,768 B2 | 2/2007 | Nakamura et al. |
| 2005/0245202 A1 | 11/2005 | Ranta et al. |

FOREIGN PATENT DOCUMENTS

EP    1 345 323 B1    2/2005

*Primary Examiner*—Stephen E Jones
(74) *Attorney, Agent, or Firm*—Slater & Matsil, L.L.P.

(57) ABSTRACT

The invention relates to an electrical circuit that includes a first signal path having differential partial paths. An interface circuit arranged in the first signal path suppresses the common-mode signals in a blocking region of the signal path, but essentially does not influence differential signal parts.

17 Claims, 2 Drawing Sheets

ELECTRICAL CIRCUIT COMPRISING A DIFFERENTIAL SIGNAL PATH AND COMPONENT WITH SUCH A CIRCUIT

This application is a continuation of co-pending International Application No. PCT/DE2007/001752, filed Sep. 27, 2007, which designated the United States and was not published in English, and which claims priority to German Application No. 10 2006 046 279.3 filed Sep. 29, 2006, both of which applications are incorporated herein by reference.

BACKGROUND

An electrical circuit with differential signal paths is known from publication EP 1 345 323 A1, with U.S. counterparts U.S. Pat. Nos. 6,900,705 and 7,176,768.

SUMMARY

In one aspect, a circuit with a differential signal path has only slight phase errors is disclosed.

Embodiments of the invention disclose an electrical circuit with a first signal path that is designed for data transmission in a frequency range and comprises differential partial paths. A matching circuit arranged in the first signal path suppresses the common-mode signals in a blocking region, i.e., outside the passband of this signal path.

The disclosed circuit makes it possible to influence a common-mode signal in a frequency range in which this is a dominant signal part. In this case the differential signal parts of a useful signal that is transmitted in the passband of the first signal path are preferably essentially unaffected.

The first signal path is designed for the data transmission in a first frequency range. The electrical circuit preferably comprises a second signal path that is designed for the data transmission in a second frequency range. The matching circuit preferably suppresses common-mode signals in the second frequency range.

The first signal path preferably is a reception path and the second signal path is a transmission path.

In one advantageous embodiment, the circuit comprises an antenna circuit and a transceiver circuit that are electrically connected to one another by means of sections of the first and the second signal path. The matching circuit is preferably arranged between a reception output of the antenna circuit and a reception input of the transceiver circuit. The matching circuit ensures the suppression of the common-mode signal at the sensitive reception input of the transceiver circuit in the blocking region of the reception path.

The disclosed circuit is particularly suitable for processing mobile communications signals or other radio signals such as, e.g., multimedia signals, and can be used in a mobile telephone. The circuit is preferably designed for several transmission systems. A reception path and a transmission path are assigned to each transmission system. However, several transmission systems can also use a common transmission path. In the respective reception path, the common-mode signal can be suppressed by the matching circuit arranged in this path at the transmission frequency of the same transmission system or of another transmission system.

The term "transceiver circuit" refers to a transmitting-receiving circuit that comprises at least one transmitter and at least one receiver. A radio band preferably comprises a transmitting band and a receiving band that preferably does not overlap with the transmitting band, but that lies in the vicinity of the transmitting band with respect to the frequency. A separate transmission path and reception path are preferably provided for each radio band.

In one preferred embodiment, the matching circuit comprises at least one shunt arm that connects the differential partial paths to one another. The shunt arm comprises at least one grounded series resonant circuit, the resonance frequency of which lies in the blocking region of the first signal path.

The shunt arm preferably comprises a series circuit of two inductors and a grounded capacitance, wherein the series circuit is connected to an electrical junction arranged between the inductors. The inductors arranged in the shunt arm preferably have the same inductance value.

The transceiver circuit comprises a transmitting circuit and a receiving circuit that preferably are monolithically integrated into a common transceiver chip. The transceiver chip represents an integrated circuit (IC), i.e., a compact component with electrical connections that are preferably arranged on its underside. The antenna circuit is sometimes also referred to as a front-end circuit and preferably is also realized in the form of a compact component with external electrical connections.

The disclosed circuit is preferably realized in a component with a supporting substrate and a transceiver chip that is solidly connected thereto. The chip with the antenna circuit preferably is also mounted on the supporting substrate. The matching circuit preferably is at least partially realized in the supporting substrate.

A particularly suitable supporting substrate is a multilayer substrate that comprises metallization layers and dielectric layers arranged between these. The dielectric layers can consist of, e.g., a ceramic or organic material. Inductors and capacitors, particularly the impedance elements of the matching circuit, can be realized in the metallization layers of the supporting substrate by means of elongated, and if applicable, folded or spiral-shaped strip conductors and conductor surfaces that lie opposite one another.

At least part of the antenna circuit can be realized in the supporting substrate. At least part of the antenna circuit can be realized in a chip that is fixed on the supporting substrate.

The antenna circuit can comprise a switch that serves for switching between the first and the second signal path.

The antenna circuit can also comprise filters, particularly at least one low-pass filter, at least one high-pass filter, at least one band-pass filter, and at least one band-stop filter. These filters are arranged in the signal paths of the circuit. The low-pass filters, the high-pass filters and the band-stop filters can be integrated, for example, into the supporting substrate. A band-stop filter, as well as a band-pass filter, can also comprise resonators that operate with acoustic waves. Filters of this type are preferably realized in a chip that is fixed on the supporting substrate.

At least one filter is preferably arranged in each signal path (transmission path, reception path). Two filters can form a frequency-separating filter, particularly a duplexer or a diplexer. The frequency-separating filter can, in principle, replace the switch. However, it can also be arranged between the antenna and the switch. It would also be possible to arrange the switch between the antenna and the frequency-separating filter.

All chips arranged on the supporting substrate are preferably electrically connected thereto. The filters and the switch can be realized in separate chips or in a common chip.

The transceiver circuit preferably comprises a pre-amplifier that is arranged in the reception path. In principle, the transceiver circuit can also comprise a power amplifier that is arranged in the reception path. However, the power amplifier can also be arranged between the transceiver circuit and the antenna circuit. If the disclosed circuit is designed for several transmission systems, several power amplifiers can be arranged in an amplifier circuit that is realized in the form of an integrated circuit (amplifier IC).

The signals occurring at the resonance frequency of the resonant circuit are grounded, i.e., a HF short-circuit to ground is produced. Consequently, a common-mode part of an electrical signal can be suppressed in the reception path, particularly at a transmitting frequency, while the differential signal part is essentially unaffected by the matching circuit. In the reception path of a radio band, the transmitter of this radio band or of another radio band can be suppressed.

A leakage signal to be suppressed in a reception path that originates from the transmission path of the disclosed circuit due to crosstalk is primarily a common-mode signal because a common-mode signal dominates at the output of the receiving filters integrated into the antenna circuit outside the receiving range, particularly in the frequency range of the transmission signal to be suppressed. The disclosed circuit makes it possible to reduce phase errors in the reception path at transmission frequencies. In this case, it is possible to reduce the power of the leakage signal at the reception input of a transceiver IC. The common-mode part of the leakage signal can be reduced in the reception path during the transmission mode without interfering with the useful signal in the reception mode.

BRIEF DESCRIPTION OF THE DRAWINGS

The disclosed circuit is described below with reference to schematic drawings that are not true-to-scale. In these drawings.

The following list of reference symbols may be used in conjunction with the drawings:

| | |
|---|---|
| ANT | Antenna |
| CH1, CH2, CH3 | Chips |
| F1, F2, F3 | Filters |
| FEM | Antenna circuit |
| IN1, IN2, IN3 | Reception input |
| M1, M2, M3 | Matching circuit |
| OUT1, OUT2 | Transmission output |
| PA | Power amplifier |
| SP1 | First signal path |
| SP2 | Second signal path |
| SW | Switch |
| TR | Transceiver circuit |
| TS | Supporting substrate |

DETAILED DESCRIPTION

Figure 1:
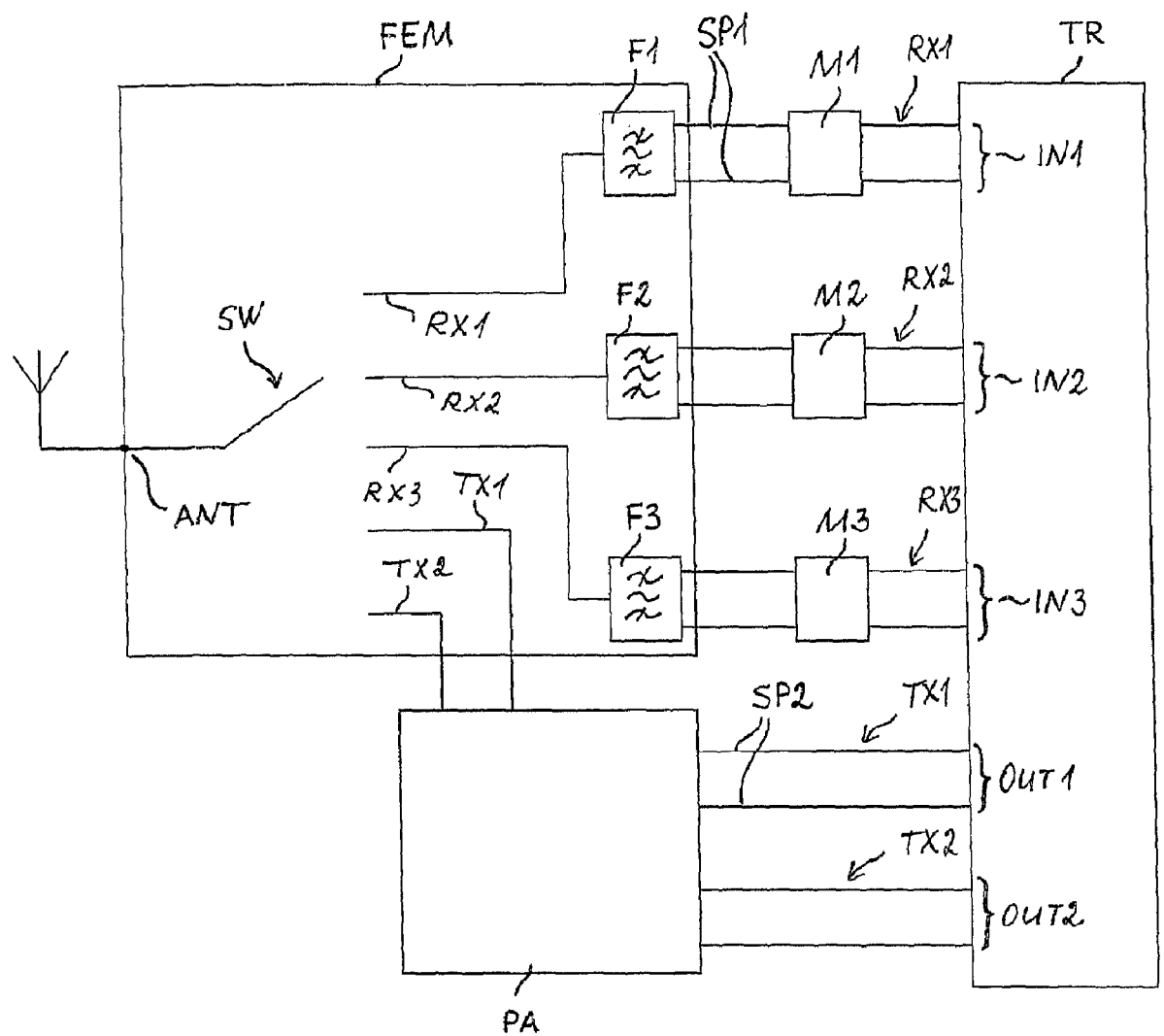
FIG. 1 shows a circuit with a transceiver, an antenna circuit and adaptor circuits arranged between them.

FIG. 1 shows a circuit with a transceiver circuit TR and an antenna circuit FEM. In this example, the circuit is designed for three transmission bands. The circuit comprises three reception paths RX1, RX2, RX3 and two transmission paths TX1, TX2. The paths RX1, TX1 are assigned, e.g., to the system GSM900. The paths RX2, TX2 are assigned to the system GSM1800 and the paths RX3, TX2 are assigned to the system GSM1900.

Depending on the transmission mode, the signal paths RX1, RX2, RX3, TX1, TX2 are connected to an antenna path by means of a switch SW that is connected to an antenna connection ANT.

A band-pass filter F1 is arranged in the reception path RX1, a band-pass filter F2 is arranged in the reception path RX2 and a band-pass filter F3 is arranged in the reception path RX3. The passband of these filters comprises the reception band of the respective transmission system. The antenna circuit FEM can comprise at least one other filter, preferably a low-pass filter, that is arranged in at least one of the transmission paths TX1, TX2. At least some of the filters can be realized in a common chip. However, the filters can also be realized in separate chips. The band-pass filters can comprise resonators that operate with acoustic waves.

The transceiver circuit TR comprises a transmitter circuit and a receiver circuit, both of which are preferably realized in a transceiver IC. The transceiver circuit TR is realized, e.g., in a chip CH1 illustrated in FIG. 5.

The antenna circuit FEM comprising the filters F1, F2, F3 and a switch SW is realized, e.g., in the chip CH2. The switch and the filters are preferably fixed on a common substrate in this case. It is possible to integrate the matching circuits M1, M2, M3 into this substrate. Filters, particularly low-pass filters or high-pass filters arranged in the transmission paths TX1, TX2, can also be integrated into this substrate. However, the filters can also be integrated into a supporting substrate TS illustrated in FIG. 5.

The supporting substrate TS can comprise a printed circuit board. The supporting substrate can also comprise a ceramic substrate. The chips can also comprise a ceramic substrate.

The chips, into which are integrated the components of the disclosed circuit, such as, e.g., the antenna circuit, the transceiver circuit and the amplifier circuit, are preferably realized in the form of SMD-components. The antenna circuit preferably comprises a substrate on which are arranged, e.g., the filters and the switch.

The filters are preferably realized in the form of baluns, i.e., they have an asymmetric (unbalanced) input gate and a symmetric (balanced) output gate. In another variation, a balun can be connected in series to at least one of these filters.

A section of the reception paths that is respectively arranged between the reception inputs IN1, IN2, IN3 of the transceiver circuit TR and the antenna circuit FEM comprises two partial paths and is provided for routing a differential signal. A section of the transmission paths that is arranged between the transmitting outputs OUT1, OUT2 of the transceiver circuit TR and the antenna circuit FEM can also be provided for routing a differential signal.

The reception inputs IN1, IN2, IN3 are respectively realized in the form of a balanced gate. A matching circuit M1, M2, M3 is arranged between the antenna circuit FEM and the reception inputs IN1, IN2, IN3 of the transceiver circuit TR in each reception path RX1, RX2, RX3. The matching circuit is preferably realized as shown in the variation according to FIG. 2. The matching circuits M1, M2, M3 are preferably integrated into the supporting substrate TS.

Figure 5:
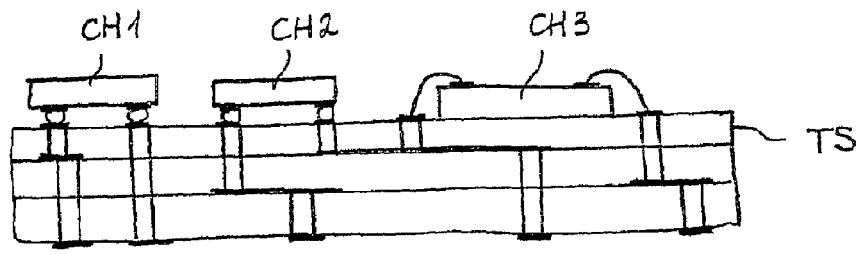
FIG. 5 shows a component in which the disclosed circuit is realized.

An amplifier circuit PA that comprises at least one power amplifier per transmission path is arranged between the transmitting outputs OUT1, OUT2 of the transceiver circuit TR and the antenna circuit FEM. In the variation according to FIG. 1, the amplifier circuit PA is realized in the form of a separate module or chip CH3 (FIG. 5). However, the amplifier circuit can also form part of the transceiver circuit TR.

In the transmission mode, the transceiver circuit TR generates a high-frequency signal that is amplified by the power amplifier and fed to an antenna via the antenna circuit FEM. This transmission signal is transmitted in the second signal path SP2. Due to the finite insulation between the signal paths SP1 and SP2 in the antenna circuit FEM, a leakage signal, i.e., part of the transmission power, reaches the reception input IN1 of the transceiver circuit. This leakage signal interferes with the modulation spectrum of the transmitter circuit due to crosstalk effects within the transceiver TR. The matching circuits M1, M2, M3 serve to suppress the common-mode part of the leakage signal in the respective signal path, and therefore contribute to improving the modulation spectrum of the transmitter circuit.

The chips CH1, CH2, CH3 can comprise SMD-components. (SMD stands for Surface Mounted Device). However, they can also be electrically connected to the contact pads of the supporting substrate TS by means of bonding wires, as with the chip CH3 illustrated in FIG. 5.

Figure 2:
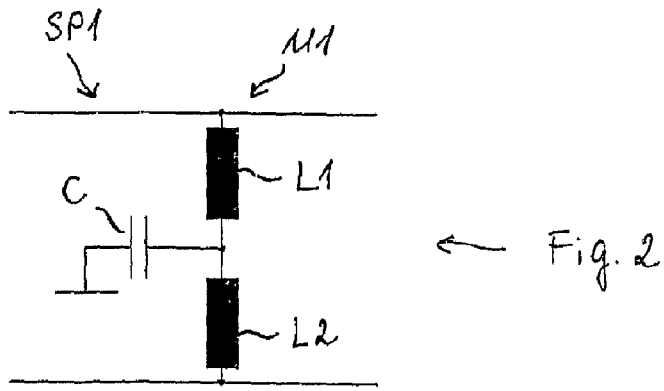
FIG. 2 shows an exemplary matching circuit.

FIG. 2 shows a section of a first signal path SP1 that corresponds to the reception path RX1 in the variation according to FIG. 1. This section comprises the matching circuit M1. The matching circuits M2, M3 are preferably realized identically to the matching circuit M1.

The first signal path SP1 is assigned to a first system. The circuit comprises a second signal path SP2 that can be assigned to the first system or to another system. In the variation according to FIG. 1, the second signal path SP2 is identical to the transmission path TX1 of the first system. However, the second signal path SP2 can also correspond to the transmission path TX2 if the common-mode signal part is to be suppressed in the first signal path SP1 at the transmission frequency of the second system.

The first signal path SP1 comprises two partial paths that are connected to one another by a shunt arm. Two series-connected inductors L1, L2 arranged in the shunt arm preferably have the same inductances value L1=L/2, L2=L/2. The impedance of the inductor L1, L2 is $Z_L=\omega L/2$. The value L is preferably chosen such that $Z_L/Z_O>3$. $Z_O$ is the characteristic impedance in the respective signal path. A high inductance makes it possible to cause only insignificant interference with the transmission function in the differential partial paths.

A grounded capacitor C is connected to the electrical junction that is arranged between the inductors L1, L2. The values for the capacitor and the inductors are chosen such that the resonance frequency $f_r=\frac{1}{2}\pi(L_{1,2}C)^{1/2}$ of a series resonant circuit that comprises the capacitor C and one of the inductors L1, L2 lies in the blocking region of the first signal path SP1. This blocking region preferably comprises a transmission band of the second signal path SP2. The frequency $f_r$ lies below the lower limiting frequency and above the upper limiting frequency of the passband of the path SP1.

Figure 3:
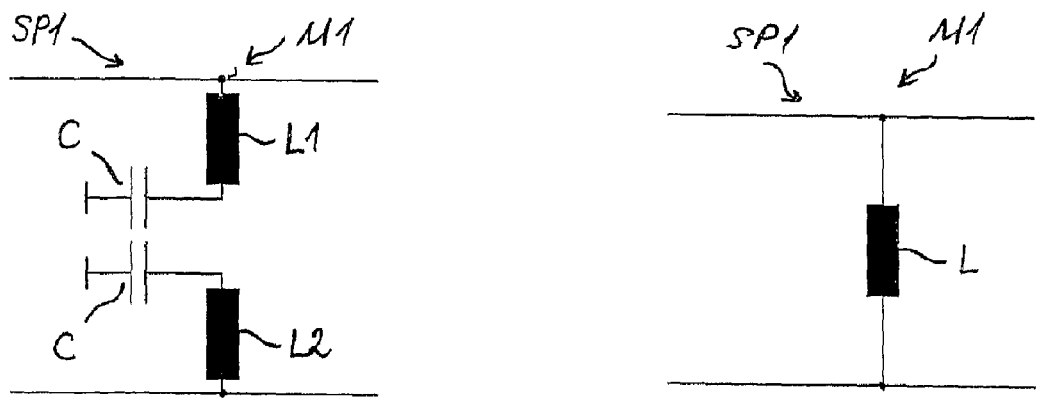
FIG. 3 shows an equivalent circuit diagram of the matching circuit according to FIG. 2 for the common-mode signal.
Figure 4:
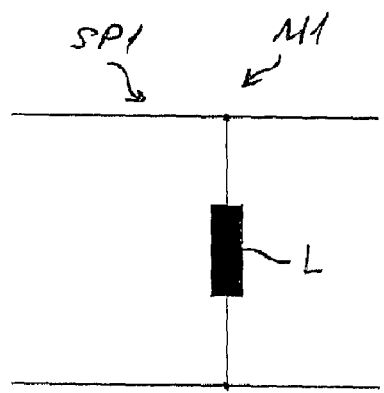
FIG. 4 shows an equivalent circuit diagram of the matching circuit according to FIG. 2 for the push-pull signal.

The equivalent circuit diagram of the matching circuit M1 illustrated in FIG. 2 is illustrated at the resonance frequency in FIG. 3 and outside the resonance frequency in FIG. 4. Outside the resonance, the series circuit of the inductors L1, L2 acts as one inductor L=L1+L2. The inductor L1 and the capacitor C form a first acceptor circuit to ground while the inductor L2 and the capacitor C form a second acceptor circuit to ground. At the resonance frequency, each acceptor circuit produces an HF short circuit to ground. The resonance frequency of the two acceptor circuits lies in the transmission band of the second signal path SP2.

At the resonance frequency of the acceptor circuits, a pole is produced in the transmission function of the first signal path SP1. The values of C and L are chosen such that this pole results at the transmission frequency to be suppressed.

In one variation, the inductors L1, L2 can be replaced with capacitors and the grounded capacitor C can be replaced with a grounded inductor. In this case, two acceptor circuits that produce an HF short circuit to ground at the predetermined frequency are also formed.

The entire circuit illustrated in FIG. 1 can be integrated into a compact component, i.e., a component realized in the form of one structural unit. At least a few of the partial circuits FEM, TR, PA, and, in particular, the matching circuits M1, M2, M3 can be integrated into the supporting substrate TS. At least a few of these partial circuits, particularly FEM, TR and PA, can alternatively be realized in the form of SMD-components and mounted on the supporting substrate TS. In one advantageous variation, all partial circuits are integrated into the supporting substrate TS. In another advantageous variation, all partial circuits are mounted on the supporting substrate TS.

In addition to the disclosed circuit, the surface-mountable component illustrated in FIG. 5 can also comprise other functional blocks such as, e.g., switches, filters, frequency-separating filters, amplifiers or other components of a transmitting-receiving device that are not illustrated in the figures.

What is claimed is:

1. An electrical circuit comprising:
a first signal path that is designed for data transmission in a frequency range and comprises differential partial paths, wherein a matching circuit arranged in the first signal path and suppresses common-mode signals outside a passband of the first signal path, wherein the matching circuit essentially does not affect differential signal parts in the passband of the first signal path, and
a second signal path that is designed for data transmission in a second frequency range, wherein the matching circuit suppresses common-mode signals in the second frequency range.

2. The circuit according to claim 1, wherein the first signal path is a reception path and the second signal path is a transmission path.

3. The circuit according to claim 1, further comprising:
an antenna circuit and a transceiver circuit that are respectively arranged in the first and in the second signal paths, wherein the matching circuit is arranged between a reception output of the antenna circuit and a reception input of the transceiver circuit.

4. The circuit according to claim 1,
wherein the matching circuit comprises at least one shunt arm that connects the differential partial paths to one another, and
wherein the shunt arm comprises at least one grounded series resonant circuit, a resonance frequency of which lies in a blocking region of the first signal path.

5. The circuit according to claim 4,
wherein the shunt arm comprises a series circuit of two inductors and a grounded capacitor, wherein the grounded capacitor is connected to an electrical node arranged between the inductors.

6. An electrical circuit comprising:
a first signal path designed for data transmission in a first frequency range and comprising differential partial paths;
a second signal path designed for data transmission in a second frequency range; and
a matching circuit that suppresses common-mode signals outside a passband of the first signal path and suppresses common-mode signals in the second frequency range, wherein the matching circuit essentially does not affect differential signal parts in the passband of the first signal path.

7. A component comprising:
a supporting substrate; and
circuitry attached to the supporting substrate, the circuitry comprising:
   a first signal path designed for data transmission in a first frequency range and comprising differential partial paths;
   a second signal path designed for data transmission in a second frequency range; and
   a matching circuit that suppresses common-mode signals outside a passband of the first signal path and suppresses common-mode signals in the second frequency range,
wherein the matching circuit essentially does not affect differential signal parts in the passband of the first signal path.

8. The component according to claim 7, wherein the first signal path is a reception path and the second signal path is a transmission path.

9. The component according to claim 7, wherein the matching circuit comprises at least one shunt arm that connects the differential partial paths to one another, and wherein the shunt arm comprises at least one grounded series resonant circuit, a resonance frequency of which lies in a blocking region of the first signal path.

10. The component according to claim 9, wherein the shunt arm comprises a series circuit of two inductors and a grounded capacitor, wherein the grounded capacitor is connected to an electrical node arranged between the inductors.

11. The component according to claim 7, further comprising an antenna circuit and a transceiver circuit that are arranged in the first and second signal paths, wherein the matching circuit is arranged between a reception output of the antenna circuit and a reception input of the transceiver circuit.

12. The component according to claim 11, wherein the transceiver circuit is formed on a chip that is physically attached to the supporting substrate.

13. The component according to claim 12, wherein the matching circuit is at least partially realized in the supporting substrate.

14. The component according to claim 13, wherein at least part of the antenna circuit is realized in the supporting substrate.

15. The component according to claim 13, wherein at least part of the antenna circuit is realized in a second chip that is physically attached to the supporting substrate.

16. The component according to claim 15, wherein the antenna circuit comprises a switch that serves to switch between the first signal path and the second signal path.

17. The component according to claim 16, wherein the switch is fixed on the supporting substrate.

* * * * *